(12) United States Patent
Anzai

(10) Patent No.: US 7,335,993 B2
(45) Date of Patent: Feb. 26, 2008

(54) MULTI CHIP PACKAGE

(75) Inventor: Yasuhito Anzai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 510 days.

(21) Appl. No.: 10/639,633

(22) Filed: Aug. 13, 2003

(65) Prior Publication Data
US 2004/0032016 A1 Feb. 19, 2004

(30) Foreign Application Priority Data
Aug. 19, 2002 (JP) ............... 2002-237747

(51) Int. Cl.
H01L 23/48 (2006.01)
(52) U.S. Cl. .................. 257/777; 257/686; 257/731
(58) Field of Classification Search ............... 257/783, 257/685–696, 777
See application file for complete search history.

(56) References Cited
U.S. PATENT DOCUMENTS
5,422,435 A * 6/1995 Takiar et al. ............... 174/521
6,072,243 A * 6/2000 Nakanishi ................... 257/783
2003/0038355 A1* 2/2003 Derderian ................... 257/686

FOREIGN PATENT DOCUMENTS
| JP | 8-88316 | 4/1996 |
|----|---------|--------|
| JP | 2002-57272 | 2/2002 |
| JP | 2003-7964 | 1/2003 |
| JP | 2003-179200 | 6/2003 |

* cited by examiner

Primary Examiner—Leonardo Andujar
(74) Attorney, Agent, or Firm—Volentine & Whitt, P.L.L.C.

(57) ABSTRACT

A multi chip package includes a first semiconductor chip, a second semiconductor chip and a spacer. The spacer is formed between the first semiconductor chip and the second semiconductor chip. The second semiconductor chip is fixed on the first semiconductor chip by an adhesive material that is formed on the first semiconductor chip. Since the spacer is formed between the first semiconductor chip and the second semiconductor chip, the space between the first semiconductor chip and the second semiconductor chip is even.

20 Claims, 6 Drawing Sheets

US 7,335,993 B2

MULTI CHIP PACKAGE

CROSS REFERENCE TO RELATED APPLICATION

The present application claims priority under 35 U.S.C. §119 to Japanese Patent Application No. 2002-237747, filed Aug. 19, 2002, which is herein incorporated by reference in their entirety for all purposes.

BACKGROUND OF THE INVENTION

1. Field of the Invention

The present invention relates to a multi chip package for fixing each chip by a paste.

2. Description of the Related Art

FIG. 1 is a schematic diagram of the conventional multi chip package.

In FIG. 1, a first semiconductor chip 103 is mounted on the die pad 101. A second semiconductor chip 104 is mounted on the first semiconductor chip 103. The second semiconductor chip 104 is fixed to the top surface of the first semiconductor chip 103 using an adhesive tape 105. The adhesive tape 105 is made by an insulating material. A plurality of leads 102 are located around the die pad 101. The leads 102 are electrically connected to the semiconductor chips 103 and 104 through conductive lines. The die pad 101 and the first and second semiconductor chips 103 and 104 are encapsulated by a sealing resin 106.

In the conventional multi chip package, each of the semiconductor chips is usually adhered by the insulating tape. As shown in FIG. 1, the adhesive tape 105 is attached to the entire back surface of the second semiconductor chip 104. Therefore, the second semiconductor chip 104 is fixed to the first semiconductor chip 103 strongly and also the second semiconductor chip 104 does not tilt.

However, the adhesive tape 105 is expensive. Therefore, various pastes are used as an adhesive material instead of the insulating tape.

FIG. 2 is a schematic diagram of the multi chip package using an adhesive paste.

In FIG. 2, a first semiconductor chip 203 is mounted on a die pad 201. A second semiconductor chip 204 is mounted on the first semiconductor chip 203. The second semiconductor chip 204 is fixed to a top surface of the first semiconductor chip 203 using an adhesive paste 205. A plurality of leads 202 are located around the die pad 201. The leads 202 are electrically connected to the semiconductor chips 203 and 204. The die pad 201 and the first and second semiconductor chips 203 and 204 are sealed by a sealing resin 206.

Such multi chip package is described in Japanese Laid-Open Patent No. Shou 63(1988)-55943 or Japanese Laid-Open Patent No. 2000-340934.

Since the adhesive paste 205 is fluid resin, the first semiconductor chip 203 is easy to tilt. When the first semiconductor chip 203 tilts heavily, the first semiconductor chip 203 might touch the surface of the second semiconductor chip 204 as shown in FIG. 3.

Further, it is difficult to form the paste evenly on the first semiconductor chip 203.

Accordingly, in an object of the present invention, a multi chip package for decreasing the tilt of the semiconductor chip is provided.

SUMMARY OF THE INVENTION

According to one aspect of the present invention, there is provided a multi chip package that includes a first semiconductor chip, a second semiconductor chip and a spacer. The spacer is formed between the first semiconductor chip and the second semiconductor chip. The second semiconductor chip is fixed on the first semiconductor chip by an adhesive material that is formed on the first semiconductor chip. Since the spacer is formed between the first semiconductor chip and the second semiconductor chip, the space between the first semiconductor chip and the second semiconductor chip is even.

DETAILED DESCRIPTION OF THE PREFERRED EMBODIMENTS

Figure 1:
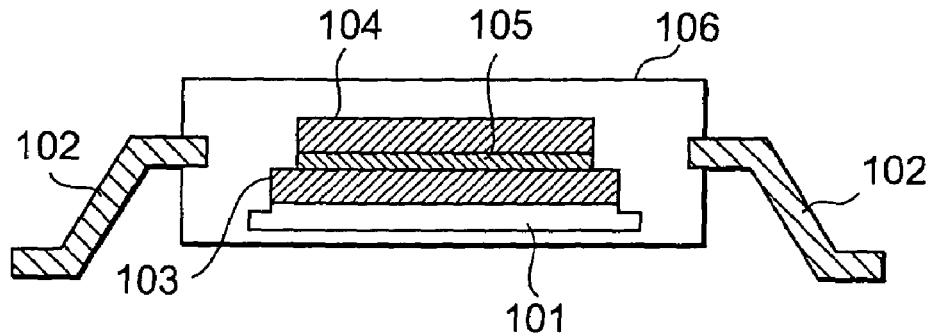
FIG. 1 is a cross-sectional view of a conventional multi chip package.
Figure 2:
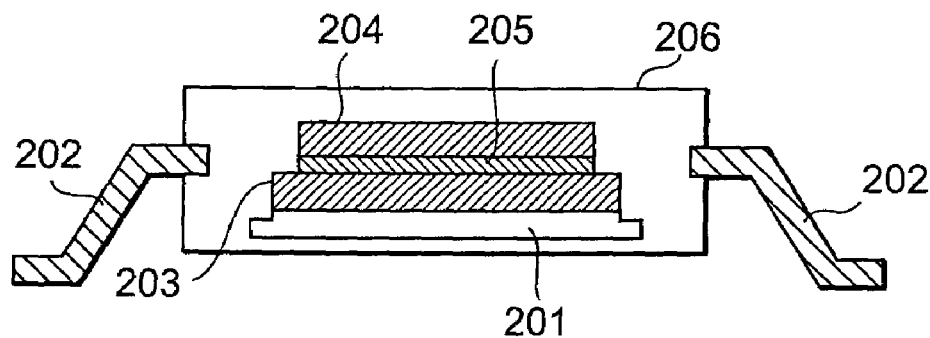
FIG. 2 is a cross-sectional view of the conventional multi chip package using the paste material.
Figure 3:
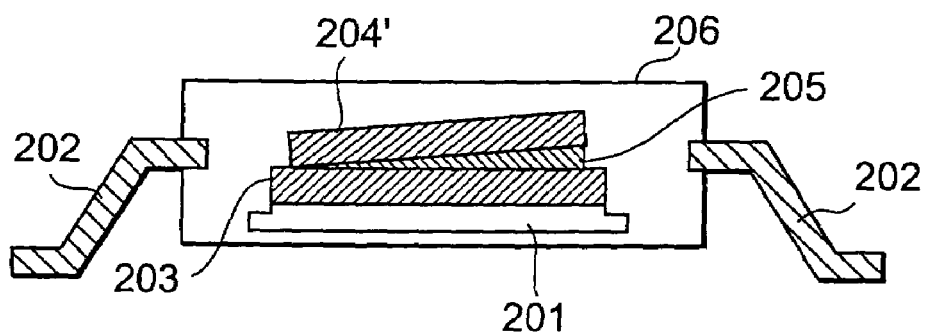
FIG. 3 is a schematic diagram showing the trouble of the conventional multi chip package.

A multi chip package according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 4:
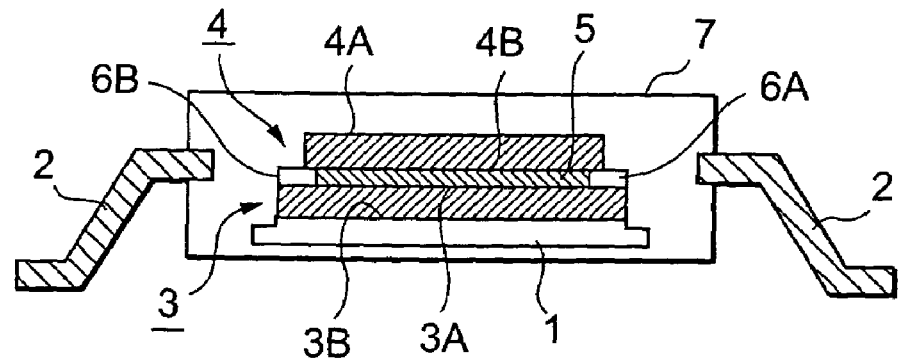
FIG. 4 is a cross-sectional view of a multi chip package of a first preferred embodiment.
Figure 5:
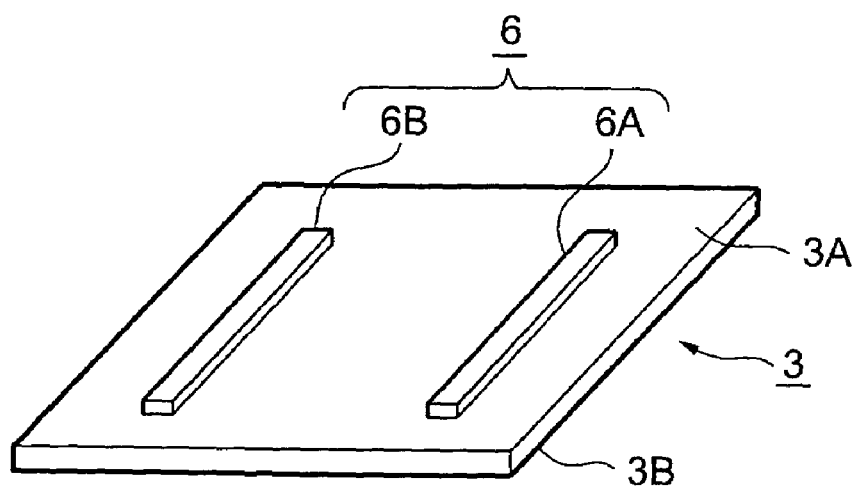
FIG. 5 is an oblique perspective figure of a semiconductor chip of the first preferred embodiment.

FIG. 4 is a cross-sectional view of a multi chip package of a first preferred embodiment. FIG. 5 is an oblique perspective figure that shows a semiconductor chip of the first preferred embodiment.

A first semiconductor chip 3 is mounted on the die pad 1. The first semiconductor chip 3 has a first surface 3A and a second surface 3B which is opposite to the first surface 3A.

A second semiconductor chip 4 is mounted over the first surface 3A of the first semiconductor chip 3. A plurality of terminals 2 are located around the second semiconductor chip 4. A first spacer 6 that includes sub-spacers 6A and 6B formed on the first surface 3A of the first semiconductor chip 3. A shape of sub-spacers 6A and 6B is linear, and the sub-spacers 6A and 6B is located along a pair of opposed sides of the first semiconductor chip 3 respectively. A length of the sub-spacers 6A and 6B is approximately equal, and the sub-spacers 6A and 6B are located in parallel each other. Each of the sub-spacers 6A and 6B is made from polyimide. The first semiconductor chip 3 and the second semiconductor chip 4 are fixed by an adhesive paste 5. The adhesive paste 5 is consist of adhesive resin material. The adhesive paste 5 is filled between the sub-spacers 6A and 6B. The first semiconductor chip 3, the second semiconductor chip 4 and a part of the terminals 2 are sealed by a sealing resin 7.

The spacer 6 forms a space between the first surface 3A of the first semiconductor chip 3 and the second surface 4B of the second semiconductor chip 4. Preferably, the height of the spacer 6 may be 4-10 μm.

According to the first preferred embodiment, the first semiconductor chip 3 and the second semiconductor chip 4 are fixed by the adhesive paste 5 with the spacer 6, the spacer 6 reduces tilt of the first semiconductor chip 3.

Second Preferred Embodiment

Figure 6:
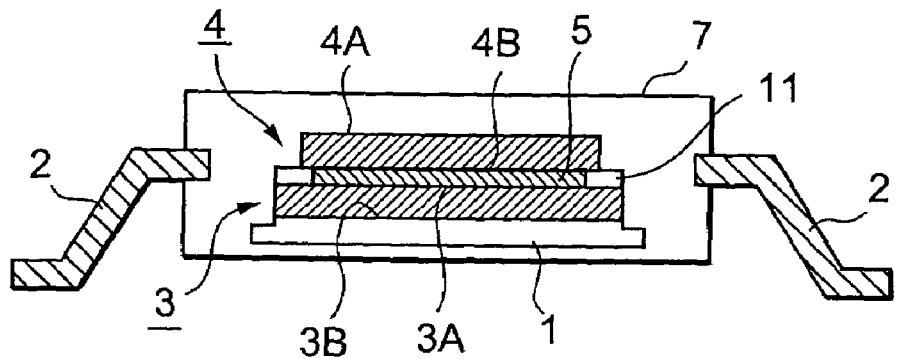
FIG. 6 is a cross-sectional view of a multi chip package of a second preferred embodiment.
Figure 7:
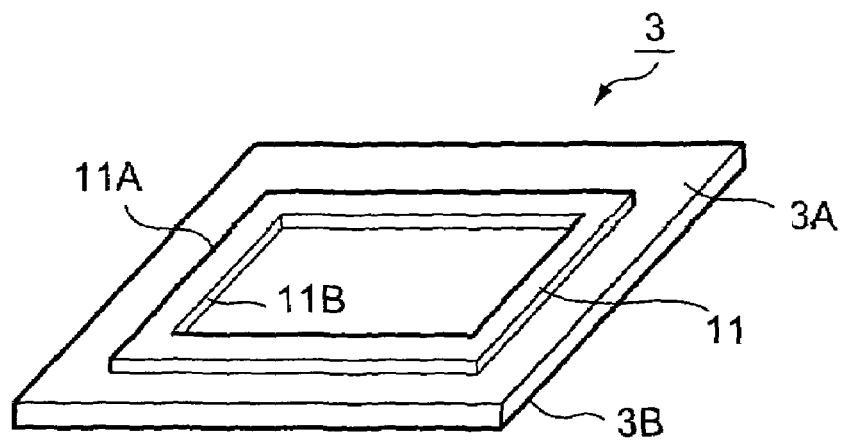
FIG. 7 is an oblique perspective figure of a semiconductor chip of the second preferred embodiment.

FIG. 6 is a cross-sectional view of a multi chip package of a second preferred embodiment. FIG. 7 is an oblique perspective figure of the semiconductor chip of the second preferred embodiment.

A spacer 11 formed on the first semiconductor chip 3 has a frame shaped configuration. That is, each sides of the spacer 11 are located along the respective sides of the first semiconductor chip 3. The other structures described in FIGS. 6 and 7 are same as those of described in the first preferred embodiment.

The spacer 11 having the frame shaped is made from polyimide. An outer side 11A of the spacer 11 is located outside of the periphery of the second semiconductor chip 4, and an inner side 11B of the spacer 11 is located inside of the periphery of the second semiconductor chip 4. The adhesive paste 5 is filled inside of the spacer 11, and fixes the first semiconductor chip 3 and the second semiconductor chip 4.

Since the spacer 11 has the frame shaped, the second semiconductor chip 4 is supported from four sides. Therefore, the distance between the each semiconductor chips 3 and 4 can be stabilized.

Figure 8:
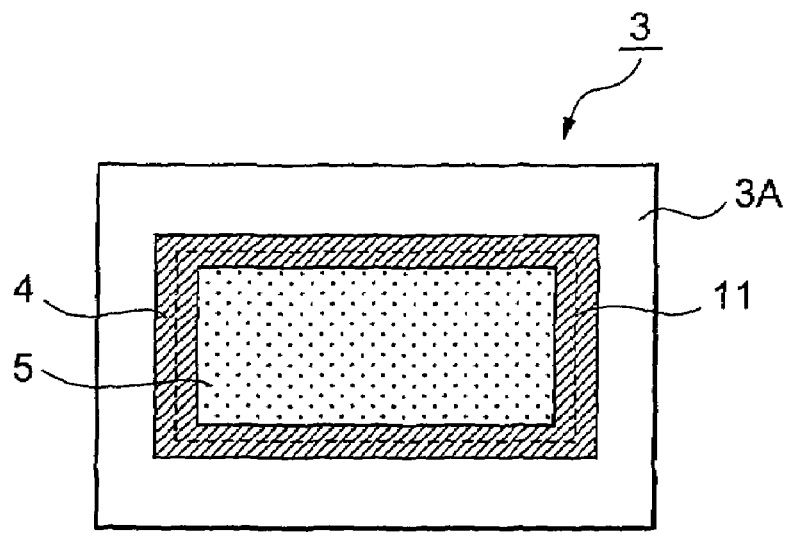
FIG. 8 is a plane view for describing an advantage of the present invention.

Further, since the paste 5 is hard to flow out to the outer side of the spacer 6, the paste 5 is filled evenly in inside of the spacer 6 as shown in FIG. 8.

Third Preferred Embodiment

Figure 9:
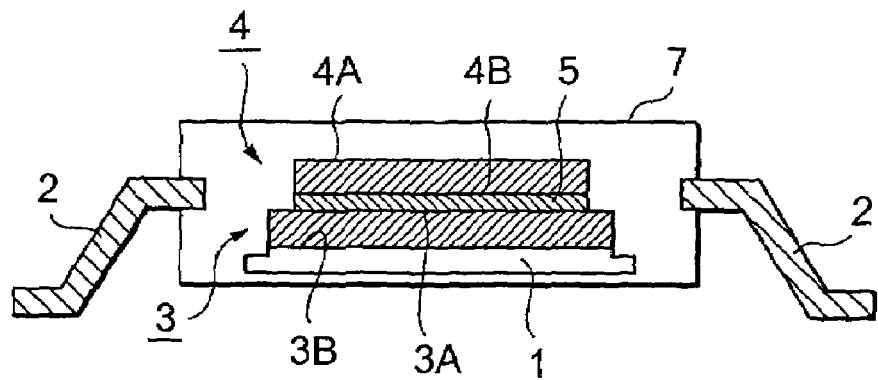
FIG. 9 is a cross-sectional view of a multi chip package of a third preferred embodiment.
Figure 10:
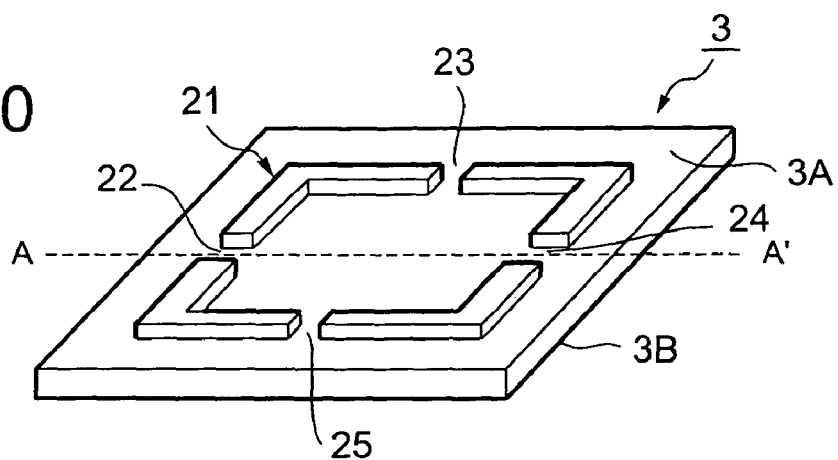
FIG. 10 is an oblique perspective figure of a semiconductor chip of the third preferred embodiment.

FIG. 9 is a cross-sectional view of a multi chip package of a third preferred embodiment. FIG. 10 is an oblique perspective figure of a semiconductor chip of the third preferred embodiment. FIG. 9 is the cross-sectional view along the line of A-A' shown in FIG. 10.

A spacer 21 formed on the first semiconductor chip 3 has a frame shaped, and the spacer 21 has gaps 22 through 25. Each sides of the spacer 21 are located along the respective sides of the first semiconductor chip 3. The gaps 22 through 25 are formed in a middle portion of each sides of the spacer 21. The other structures described in FIGS. 9 and 10 are same as those of described in the second preferred embodiment.

Figure 11:
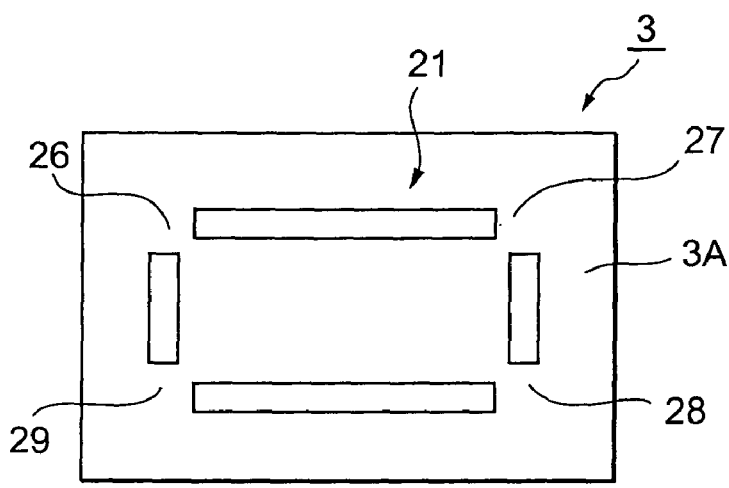
FIG. 11 is a plane view of a spacer of the third preferred embodiment.
Figure 12:
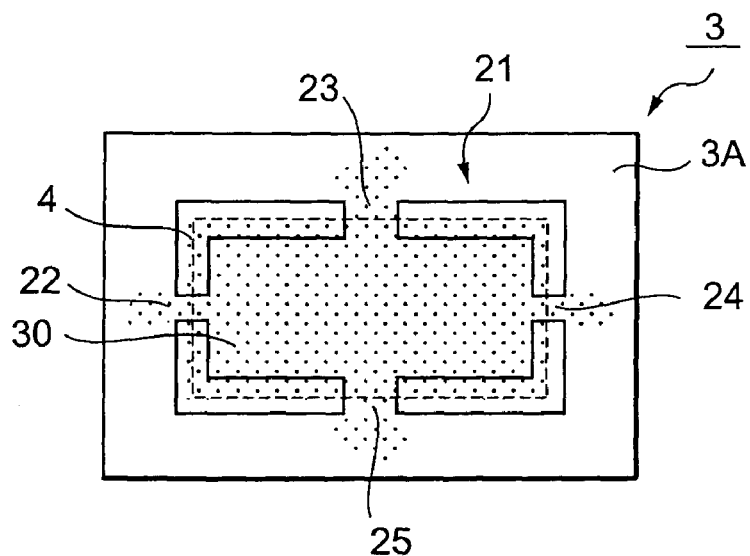
FIG. 12 is a plane view showing a flowed paste.

Since the gaps 22 through 25 are formed in the frame 21, air included in the adhesive paste 5 and an unwanted paste are eliminated from the lacked portions, as shown in FIG. 12. Therefore, the adhesive paste 5 is filled in inside of the spacer 21 evenly. The gaps 26 through 29 can be formed at each corner of the spacer 21 as shown in FIG. 11.

Fourth Preferred Embodiment

Figure 13:
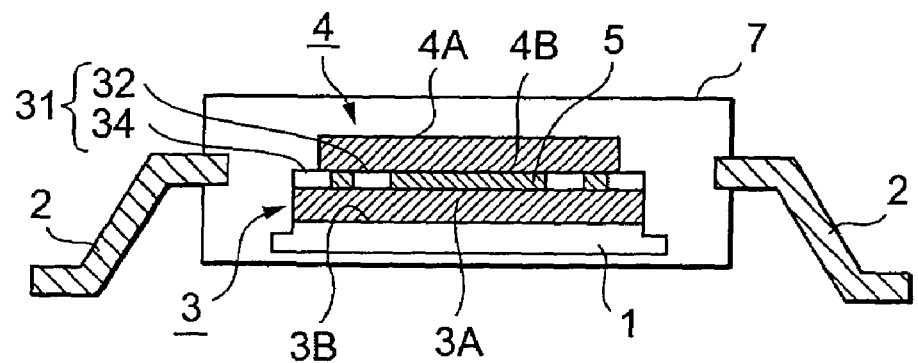
FIG. 13 is a cross-section of a multi chip package of a fourth preferred embodiment.
Figure 14:
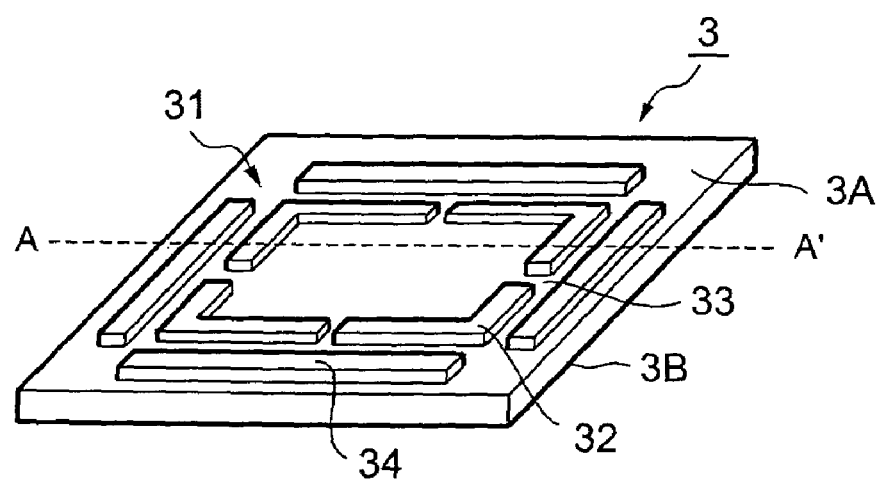
FIG. 14 is an oblique perspective figure of a semiconductor chip of the fourth preferred embodiment.

FIG. 13 is a cross-sectional view of a multi chip package of a fourth preferred embodiment. FIG. 14 is an oblique perspective figure of a semiconductor chip of the fourth preferred embodiment. FIG. 13 is the cross-sectional view along the line of A-A' in FIG. 14.

A spacer 31 is formed on the first semiconductor chip 3 has a frame shaped. The spacer 31 includes a first spacer 32 with gaps 33 and a second spacer 34. The second spacer 34 is consisted of four parts, each of them has a function as a dam. Each sides of the first spacer 32 are located along the respective side of the first semiconductor chip 3. The lacked portions are formed in a middle area of each sides of the first spacer 32. Each parts of the second spacer 34 are located between the lacked portion of the first spacer 32 and the periphery of the first semiconductor chip 3. The other structures described in FIGS. 13 and 14 are same as those of described in the third preferred embodiment.

According to the fourth preferred embodiment, each part of the second spacer 34 are formed between the gap of the first spacer 32 and the periphery of the first semiconductor chip 3.

Figure 15:
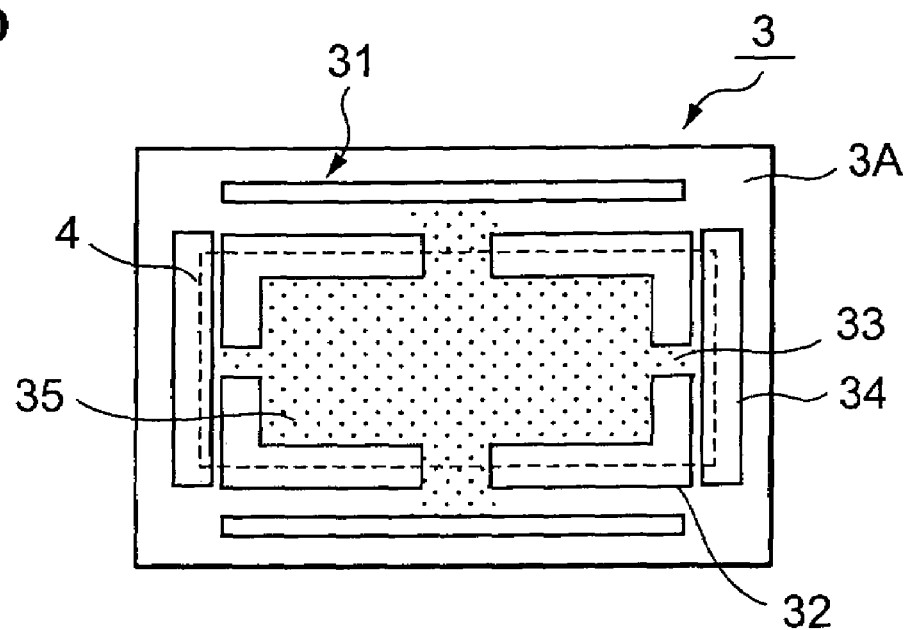
FIG. 15 is a plane view describing an advantage of the present invention.

As a result, the second spacer 34 stops the adhesive paste flowing from inside of the first spacer 32 to the periphery of the first semiconductor chip 3, as shown in FIG. 15.

Figure 16:
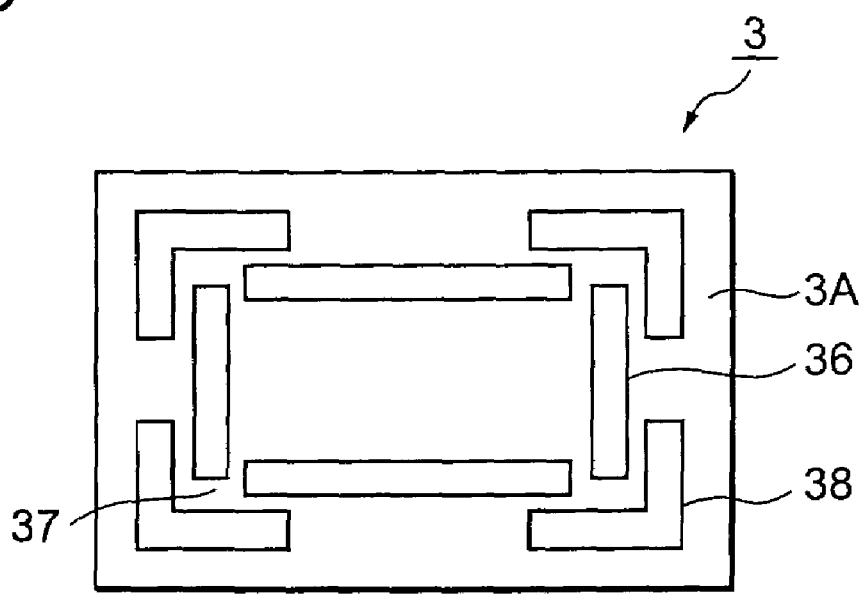
FIG. 16 is a plane view of another embodiment of the fourth preferred embodiment.

As shown in FIG. 16, the gaps 37 are formed at the corners of the first spacer 36. Each of the second spacers 38 are formed at the corner area that is located between the gap 37 and the corner of the first semiconductor chip 3. That is, since the second spacer is formed between the lacked portion and the periphery of the first semiconductor chip, the second spacer functions as the dam that stops the outflow of the paste.

While the preferred form of the present invention has been described, it is to be understood that modifications will be apparent to those skilled in the art without departing from the spirit of the invention. The scope of the invention is to be determined solely by the following claims.

What is claimed is:

1. A multichip package comprising:
a first semiconductor chip having a first surface;
a second semiconductor chip adhered directly to the first semiconductor chip by an adhesive layer; and
a first spacer between the first semiconductor chip and the second semiconductor chip,
wherein the adhesive layer and the first spacer are directly on the first surface of the first semiconductor chip, wherein a first side of the first spacer is outside a periphery of the second semiconductor chip, and wherein a second side of the first spacer is inside the periphery of the second semiconductor chip.

2. The multichip package according to claim 1, wherein the first spacer includes a plurality of sub-spacers, wherein a height of each of the sub-spacers is approximately equal.

3. The multichip package according to claim 2, wherein the sub-spacers are located along a pair of opposed sides of the first semiconductor chip.

4. The multichip package according to claim 1, wherein the first spacer has a frame shaped configuration which is located along a periphery of the first semiconductor chip.

5. The multichip package according to claim 4, wherein the first spacer has a gap.

6. The multichip package according to claim 5, further comprising a second spacer which is located between the gap in the first spacer and the periphery of the first semiconductor chip.

7. The multichip package according to claim 6, wherein said second spacer includes a plurality of sub-spacers.

8. A multichip package comprising:
 a first semiconductor chip having a first surface;
 a first spacer on the first semiconductor chip; and
 a second semiconductor chip adhered directly to the first semiconductor chip by an adhesive layer formed through the first spacer,
 wherein the adhesive layer and the first spacer are directly on the first surface of the first semiconductor chip, wherein a first side of the first spacer is outside a periphery of the second semiconductor chip, and wherein a second side of the first spacer is inside the periphery of the second semiconductor chip.

9. The multichip package according to claim 8, wherein the first spacer includes a plurality of sub-spacers, wherein a height of each of the sub-spacers is approximately equal.

10. The multichip package according to claim 9, wherein the sub-spacers are located along a pair of opposed sides of the first semiconductor chip.

11. The multichip package according to claim 8, wherein the first spacer has a frame shaped configuration which is located along a periphery of the first semiconductor chip.

12. The multichip package according to claim 11, wherein the first spacer has a gap.

13. The multichip package according to claim 12, further comprising a second spacer which is located between the gap and the periphery of the first semiconductor chip.

14. The multichip package according to claim 13, wherein said second spacer includes a plurality of sub-spacers.

15. A multichip package comprising:
 a die pad;
 a first semiconductor chip having opposite first and second surfaces, the first surface of the first semiconductor chip being mounted to the die pad;
 a second semiconductor chip having a first surface adhered to the second surface of the first semiconductor chip by an adhesive; and
 a first spacer between the second surface of the first semiconductor chip and the first surface of the second semiconductor chip,
 wherein the adhesive and the first spacer are directly on the second surface of the first semiconductor chip, wherein a first side of the first spacer is outside a periphery of the second semiconductor chip, and wherein a second side of the first spacer is inside the periphery of the second semiconductor chip.

16. The multichip package of claim 15, wherein the adhesive comprises an adhesive layer formed through the first spacer.

17. The multichip package of claim 15, wherein the first spacer includes a plurality of sub-spacers and wherein a height of each of the sub-spacers is approximately equal.

18. The multichip package of claim 15, wherein the first spacer has a frame shaped configuration which is located along a periphery of the first semiconductor chip.

19. The multichip package of claim 18, wherein the first spacer has a gap.

20. The multichip package of claim 19, further comprising a second spacer which is located between the gap in the first spacer and the periphery of the first semiconductor chip.

* * * * *